United States Patent
Sicard et al.

(10) Patent No.: US 9,071,248 B2
(45) Date of Patent: Jun. 30, 2015

(54) MOS TRANSISTOR DRAIN-TO-GATE LEAKAGE PROTECTION CIRCUIT AND METHOD THEREFOR

(75) Inventors: Thierry Sicard, Chandler, AZ (US); Laurent Guillot, Seysses (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/811,804

(22) PCT Filed: Mar. 3, 2010

(86) PCT No.: PCT/IB2010/001110
§ 371 (c)(1),
(2), (4) Date: Jul. 6, 2010

(65) Prior Publication Data
US 2012/0326690 A1   Dec. 27, 2012

(51) Int. Cl.
*G05F 1/00* (2006.01)
*H03K 17/687* (2006.01)

(52) U.S. Cl.
CPC ...... *H03K 17/687* (2013.01); *H03K 2217/0036* (2013.01)

(58) Field of Classification Search
USPC ......... 323/271, 277, 278, 280, 274, 276, 315, 323/316; 327/306, 309, 317, 321–323, 327, 327/328, 389, 427, 434, 538–543, 545, 546
See application file for complete search history.

(56) References Cited

U.S. PATENT DOCUMENTS

| | | | |
|---|---|---|---|
| 5,525,934 A * | 6/1996 | Chiu et al. | 327/318 |
| 6,255,897 B1 | 7/2001 | Klemmer | |
| 6,617,916 B1 * | 9/2003 | Kurotsu | 327/544 |
| 6,954,098 B2 * | 10/2005 | Hsu et al. | 327/313 |
| 7,046,573 B2 | 5/2006 | Takazawa et al. | |
| 7,230,806 B2 | 6/2007 | Poon et al. | |
| 7,411,376 B2 * | 8/2008 | Zhang | 323/277 |
| 7,586,725 B2 * | 9/2009 | DiVito et al. | 361/93.1 |
| 7,825,720 B2 * | 11/2010 | Ramaraju et al. | 327/543 |
| 7,852,142 B2 * | 12/2010 | Ogiwara et al. | 327/538 |
| 8,233,257 B2 * | 7/2012 | Hasegawa et al. | 361/93.9 |
| 2002/0076851 A1 * | 6/2002 | Eden et al. | 438/106 |
| 2008/0170059 A1 * | 7/2008 | Lee et al. | 345/211 |
| 2009/0040671 A1 * | 2/2009 | Zhang | 361/56 |

* cited by examiner

*Primary Examiner* — Matthew Nguyen
*Assistant Examiner* — Afework Demisse
(74) *Attorney, Agent, or Firm* — Sherry W. Schumm

(57) ABSTRACT

A circuit having an active mode and a sleep mode includes a power transistor, an amplifier, and a protection circuit. The power transistor has a first current electrode coupled to a first power supply terminal, a second current electrode as an output of the circuit for coupling to a load, and a control electrode, wherein the power transistor is characterized by having a threshold voltage and a leakage current, wherein the leakage current occurs between the control electrode and the first current electrode during the sleep mode. The amplifier has an output coupled to the control electrode of the power transistor that provides an active output during the active mode. The protection circuit detects the leakage current and prevents the leakage current from developing a voltage on the control electrode of the power transistor that exceeds the threshold voltage of the power transistor.

20 Claims, 2 Drawing Sheets

MOS TRANSISTOR DRAIN-TO-GATE LEAKAGE PROTECTION CIRCUIT AND METHOD THEREFOR

BACKGROUND

1. Field

This disclosure relates generally to circuits, and more specifically, to a drain-to-gate leakage protection circuit and method therefor.

2. Related Art

Very large MOS (metal-oxide semiconductor) transistors are used in high current applications. One application that requires a very large MOS transistor is a high-side switch used for driving a motor. Typically in a high-side switch, a drain of the MOS transistor is connected directly to a power supply voltage. When the circuit is turned off, such as during a low power operating mode, a gate-to-source voltage (VGS) of the MOS transistor is made to be zero to minimize a drain-to-source sub-threshold leakage current. However, a defect in the dielectric layer between the gate and drain may cause a leakage current from the drain to the gate of the MOS transistor even when the transistor is off. The leakage current can increase the VGS so that the MOS transistor is operating in a linear operating region when the transistor is intended to be off. Because of the large transistor size, the leakage current can be in the milliamp range. Over time, the temperature of the transistor may increase until a thermal event occurs, resulting in damage to the device. To ensure that the off transistor's VGS does not increase in the case of a gate-to-drain defect, a resistor may be connected between the gate and source to ensure the transistor's VGS is substantially zero. However, if the resistance value is too high, the resistor will be ineffective for pulling the gate voltage down. If the resistance value is too low, the transistor will be prevented from operating properly during a normal operating mode.

Therefore, what is needed is a circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
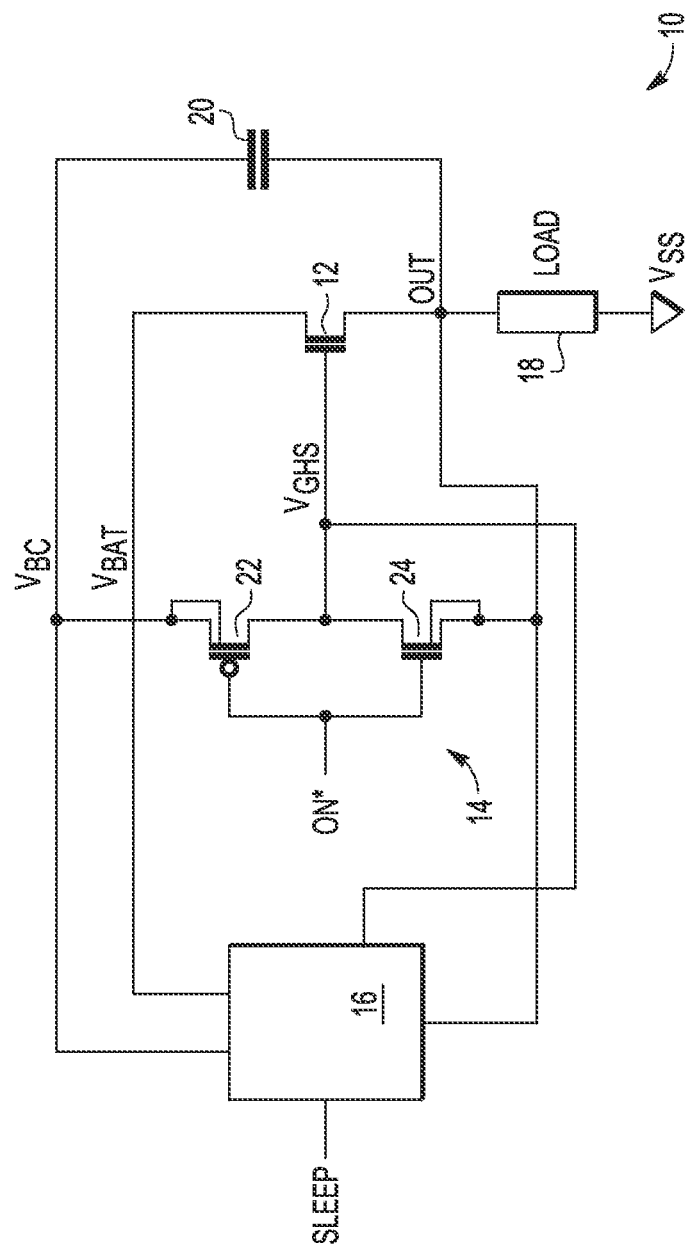
FIG. 1 illustrates, in partial block diagram form and partial schematic diagram form, a high side switch coupled to a load.

Generally, there is provided, an active drain-to-gate leakage protection circuit for controlling a gate-to-source voltage (VGS) of a power MOS (metal-oxide semiconductor) transistor in the event of an excessive drain-to-gate leakage current during an inactive operating mode. The excessive drain-to-gate leakage current may be due to a defect in the gate dielectric between the gate and drain. In one embodiment, the power MOS transistor may be part of a high-side switch for supplying current to an electric motor. During a low power mode, when the transistor is suppose to be off, the drain-to-gate leakage protection circuit detects when the power MOS transistor has a gate bias and actively operates to reduce the VGS of the power MOS transistor. This prevents the power MOS transistor from inadvertently turning on because of, for example, a defect. The protection circuit does not consume any power during a low power operating mode if no drain-to-gate leakage current is detected. During a normal operating mode, the drain-to-gate leakage protection circuit consumes no power and does not affect the operation power MOS transistor.

The semiconductor substrate described herein can be any semiconductor material or combinations of materials, such as gallium arsenide, silicon germanium, silicon-on-insulator (SOI), silicon, monocrystalline silicon, the like, and combinations of the above.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

In one aspect, there is provided, a circuit having an active mode and a sleep mode, comprising: a power transistor having a first current electrode coupled to a first power supply terminal, a second current electrode as an output of the circuit for coupling to a load, and a control electrode, wherein the power transistor is characterized by having a threshold voltage and a leakage current, wherein the leakage current occurs between the control electrode and the first current electrode during the sleep mode; an amplifier having an output coupled to the control electrode of the power transistor that provides an active output during the active mode; and a protection circuit that detects the leakage current and prevents the leakage current from developing a voltage on the control electrode of the power transistor that exceeds the threshold voltage of the power transistor. The protection circuit may comprise a current mirror circuit coupled to the first power supply terminal having a first input coupled to the control electrode of the power transistor and having a second input coupled to receive a sleep signal. The second input may be coupled to the sleep signal through a buffer circuit. The buffer circuit may comprise: a first transistor having a control electrode coupled to the sleep signal, a first current electrode coupled to the power supply terminal, and a second current electrode; and a resistance having a first terminal coupled to the second current electrode of the first transistor and a second terminal coupled to a second power supply terminal. The current mirror may have an output; the protection circuit may further comprise a first transistor having a first current electrode coupled to the gate of the power transistor, a control electrode coupled to the output of the current mirror, and a second current electrode coupled to the output of the circuit. The current mirror circuit may comprise: a current mirror coupled to the first power supply terminal having a first leg and a second leg; a first switch transistor having a control electrode as the first input of the current mirror circuit, a first current electrode coupled to the first leg, and a second current electrode as the output of the current mirror circuit; a load circuit having a first terminal coupled to the second current electrode of the first switch transistor and a second current electrode coupled to the output of the circuit; an input transistor having a control electrode as the second input of the current mirror circuit, a first current electrode coupled to the second leg, and a second current electrode coupled to the output of the circuit. The load circuit may comprise a diode-connected transistor in series with a first resistance, wherein the diode-connected transistor and the first transistor have the same threshold voltage. The current mirror circuit may further comprise a second switch transistor coupled between the input transistor and the second leg, wherein the second leg is coupled to the first current electrode of the input transistor through the second switch transistor. The circuit may further comprise: a second resistance having a first terminal coupled to the first power supply terminal and a second terminal; a second transistor having a control electrode for receiving a boosted voltage, a first current electrode coupled to the second terminal of the second resistance; and a second current electrode; and a third transistor coupled in series between the output and the second current electrode of the second transistor. The amplifier may comprise: a first N channel transistor having a control electrode for receiving an input signal, a drain coupled to the control electrode of the power transistor; a source coupled to the output of the circuit, and a body connected to the output of the circuit; and a first P channel transistor having a control electrode for receiving the input signal, a drain coupled to the control electrode of the power transistor; a source coupled to a boosted voltage, and a body connected to the boosted voltage.

In another embodiment, there is provided, a method that is for operating a power transistor using a sleep mode and an active mode, wherein during the sleep mode the power transistor has leakage current between a control electrode and a current electrode, wherein the power transistor has a threshold voltage, the method comprising: applying an input signal to the control electrode of the power transistor during the active mode; detecting the leakage current during the sleep mode; responsive to detecting the leakage current, providing a current drain on the gate of the power transistor during the sleep mode of sufficient magnitude to ensure that the threshold voltage of the power transistor is not exceeded. The method may further comprise removing the current drain during the active mode. The step of detecting may comprise: detecting a voltage on the control electrode of the power transistor; and converting the voltage to a first current. The step of providing a current drain may comprise: converting the first current to a second current; and converting the second current to the current drain. The step of converting the second current to the current drain may comprise: converting the second current to a bias voltage; and converting the bias voltage to the current drain. The method may further comprise using a current mirror circuit to detect the leakage current and to provide the current drain.

In yet another embodiment, there is provided, a power driver circuit having an active mode and a sleep mode for driving a power transistor having a first current electrode coupled to a first power supply terminal, a second current electrode for being coupled to a load, and a control electrode, wherein the power transistor is characterized by having a threshold voltage and a leakage current, wherein the leakage current occurs between the control electrode and the first current electrode during the sleep mode, the power driver circuit comprising: an amplifier having an output for being coupled to the control electrode of the power transistor, wherein the amplifier provides an active output during the active mode; and a protection circuit means coupled to the output of the amplifier for detecting the leakage current and preventing the leakage current from developing a voltage on the control electrode of the power transistor that exceeds the threshold voltage of the power transistor. The protection means prevents the leakage current from developing a voltage on the control electrode of the power transistor that exceeds the threshold voltage of the power transistor by establishing a current drain on the gate of the power transistor. The protection circuit means may comprise: a current drain circuit for being coupled to the control electrode of the power transistor; and a current mirror circuit for being coupled to the control electrode of the power transistor and controlling the current drain circuit. The current mirror circuit may detect the leakage current and biases the current drain circuit based on the magnitude of the leakage current.

FIG. 1 illustrates, in partial block diagram form and partial schematic diagram form, a high side switch 10 coupled to a load 18. High side switch 10 includes power MOS transistor 12, amplifier circuit 14, leakage protection circuit 16, and capacitor 20. In one embodiment, power MOS transistor 12 is integrated on one semiconductor die and amplifier 14 and protection circuit 16 are integrated on another die (not shown). The two die may be contained in the same package. Amplifier circuit 14 includes P-channel transistor 22 and N-channel transistor 24. Note that in other embodiments, amplifier circuit 14 may be different.

Transistor 12 has a first current electrode (drain) connected to a power supply voltage labeled "VBAT", a control electrode (gate) for receiving a gate driver signal labeled "VGHS", and a second current electrode connected to an output terminal labeled "OUT". In the illustrated embodiment, transistor 12 is an N-channel transistor. In other embodiments, transistor 12 may be a P-channel transistor. Load 18 is connected between the output terminal OUT and a power supply voltage terminal labeled "VSS". Power supply voltage terminal VSS may be coupled to ground and power supply voltage terminal VBAT may be coupled to receive a battery supplied voltage. In one embodiment, VBAT is provided by an automobile battery and load 18 is an electric motor. Also, in one embodiment, transistor 12 is a configured to function as a high-side switch for providing a current for the electric motor. In other embodiments, transistor 12 may be used for other purposes. In addition, transistor 12 may be used with other power transistors in an H-bridge configuration for driving a motor. To ensure that transistor 12 turns on fully during operation, gate driver signal VGHS is boosted to voltage level VBC above the voltage level of VBAT. The boosted voltage VBC is provided by capacitor 20.

Amplifier 14 has an output coupled to the gate of transistor 12 to supply the boosted gate drive voltage VGHS. In amplifier 14, P-channel transistor 22 has a source connected to boosted voltage VBC, a gate for receiving an input signal labeled "ON", a drain connected to the gate of transistor 12, and a body terminal connected to VBC. N-channel transistor 24 has a drain connected to the drain of transistor 22, a gate connected to the gate of transistor 22, a source connected to output terminal OUT, and a body terminal connected to output terminal OUT. Capacitor 20 has a first plate electrode connected to output terminal OUT, and a second plate electrode for providing boosted voltage VBC. Capacitor 22 provides the boosted voltage VBC.

Leakage protection circuit 16 has an input connected to receive power supply voltage terminal VBAT, an input for receiving boosted voltage VBC, a control input for receiving a mode signal labeled "SLEEP", a terminal coupled to output terminal OUT, and an output terminal coupled to the gate of transistor 12. During a normal active operating mode, high-side switch 10 functions as a conventional high-side switch. Mode signal SLEEP is negated as a logic low, disabling leakage protection circuit 16. Amplifier 14 provides a periodic boosted gate driver signal VGHS in response to receiving control signal ON*. Transistor 12 is turned on each time the boosted gate voltage VGHS is provided. When transistor 12 is on, or conductive, the battery voltage VBAT is provided to drive load 18 (e.g. a motor) through transistor 12. Generally, when transistor 12 is fully on, there is a relatively low drain-to-source resistance for driving load 18.

Figure 2:
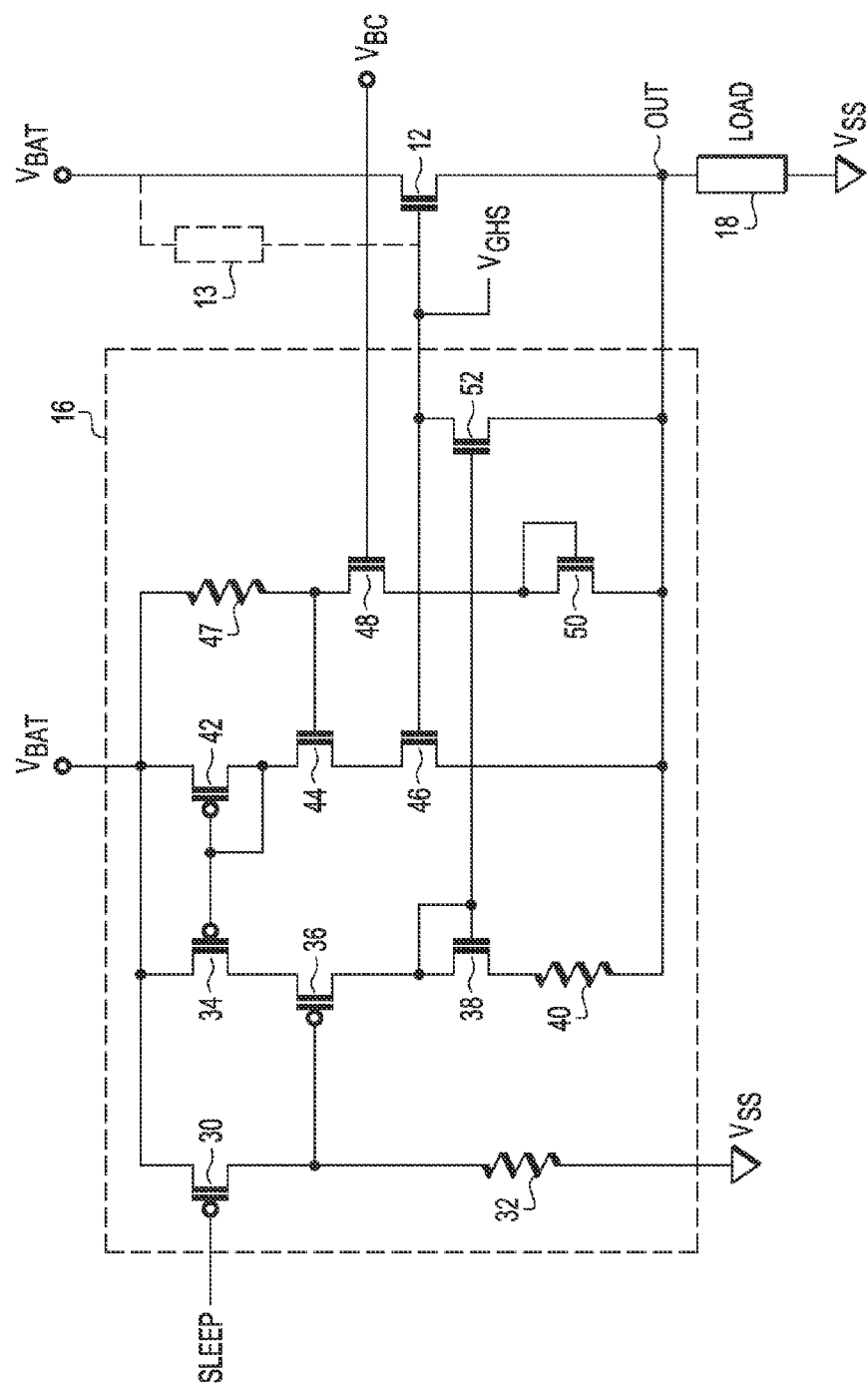
FIG. 2 illustrates, in schematic diagram form, a drain-to-gate leakage protection circuit of the high side switch of FIG. 1 in more detail.

During a low power operating mode, gate driver voltage VGHS is substantially zero volts. Transistor 12 is off, or substantially non-conductive, preventing battery voltage VBAT from being provided to load 18. However, in some cases, a leakage current may develop between the drain and gate of transistor 12. A drain-to-gate leakage path 13 is illustrated in FIG. 2. If the leakage current is large enough, the gate can be biased high enough to cause transistor 12 to operate in a linear operating region. This consumes power and may cause transistor 12 to heat up, potentially damaging transistor 12. To prevent this from happening, leakage protection circuit 16 is provided. During the low power operating mode, mode signal SLEEP is asserted as a logic high. Mode signal SLEEP may be provided by, for example, a microprocessor, a microcontroller, or the like. Protection circuit 16 will then detect any time the gate driver voltage VGHS increases above a predetermined amount. When an increased gate voltage is detected, protection circuit 16 actively pulls down the gate voltage of transistor 12. The operation of leakage protection circuit 16 will be discussed in more detail in connection with FIG. 2.

FIG. 2 illustrates, in schematic diagram form, drain-to-gate leakage protection circuit 16 of high side switch 10 of FIG. 1 in more detail. Leakage protection circuit 16 includes P-channel transistors 30, 34, 36, and 42, N-channel transistors 38, 44, 46, 48, 50, and 52, and resistors 32, 40, and 47.

P-channel transistor 30 has a source connected to VBAT, a gate for receiving mode signal SLEEP, and a drain. Resistor 32 has a first terminal connected to the drain of transistor 30, and a second terminal connected to VSS. Transistor 30 and resistor 32 function to buffer the SLEEP signal. P-channel transistor 34 has a source connected to VBAT, a gate, and a drain. P-channel transistor 36 has a source connected to the drain of transistor 34, a gate connected to the drain of transistor 30, and a drain. N-channel transistor 38 has both a gate and drain connected to the drain of transistor 36, and a source connected to VSS. P-channel transistor 42 has a source connected to VBAT, and both a gate and drain connected to the gate of transistor 34. P-channel transistors 34 and 42 form a current mirror. N-channel transistor 44 has a drain connected to the gate and drain of transistor 42, and a source. N-channel transistor 46 has a drain connected to the source of transistor 44, a gate connected to the gate of power MOS transistor 12, and a source connected to VSS. Resistor 47 has a first terminal connected to VBAT, and a second terminal. N-channel transistor 48 has a drain connected to the second terminal of resistor 47, a gate connected to receive VBC, and a source. N-channel transistor 50 is diode-connected and has both a drain and a gate connected to the source of transistor 48, and a source connected to output terminal OUT. N-channel transistor 52 has a drain connected to the gates of transistors 46 and 12, a gate connected to the gate and drain of transistor 38, and a source connected to output terminal OUT. N-channel transistors 38 and 52 form a current mirror.

A drain-to-gate leakage resistance 13 is connected between the drain and gate of transistor 12. Resistance 13 is provided to illustrate a leakage path from the drain to the gate when a defect in transistor 12 causes a break in the gate dielectric of transistor 12.

In a low power operating mode, such as a sleep mode or power down mode, mode signal SLEEP is asserted as a logic high. Transistor 30 is substantially non-conductive. The gate of transistor 36 is pulled down by resistor 32, causing transistor 36 to be conductive. Likewise, because the circuit is not in an active mode, boosted voltage VBC is equal to about zero volts, causing transistor 48 to be substantially non-conductive. The gate of transistor 44 is pulled high through resistor 47 causing transistor 44 to be on. Therefore, both legs of the current mirror comprising transistors 34 and 42 are active. Transistor 46 is provided to detect when the voltage VGHS increases during an operating mode when the gate voltage VGHS of transistor 12 is suppose to be low. If the voltage VGHS increases during sleep mode, transistor 46 will become conductive. A current through transistors 42, 44, and 46 is mirrored through transistors 34, 36, and 38 and resistor 40 biasing the gate of transistor 52 so that the gate of transistor 52 is pulled up. Transistor 52 becomes conductive, providing a current path for pulling the gate of transistor 12 low. If there is no drain-to-gate leakage current in transistor 12, then circuit 16 does not operate and consumes no power. To further limit the voltage on the gate of transistor 12, transistor 46 is designed to have a lower threshold voltage (VT) than transistor 12 so transistor 46 will turn on first.

In a normal active operating mode, signal SLEEP is a logic low, causing transistor 30 to be on, or conductive. A high voltage is provide to the gate of transistor 36, causing transistor 36 to be off, or substantially non-conductive. Transistor 48 is turned on by boosted voltage VBC. Transistor 48 and transistor 50 will pull the gate of transistor 44 low. With transistors 36 and 44 off, or substantially non-conductive, no current can flow through either leg of the current mirror formed by transistors 34 and 42 and leakage protection circuit 16 is off. This prevents protection circuit 16 from interfering with the operation of high-side switch 10 during normal operation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A first circuit having an active mode and a sleep mode, comprising:
   a power transistor having a first current electrode coupled to a first power supply terminal, a second current electrode as an output of the first circuit for coupling to a load, and a control electrode, wherein the power transistor is characterized by having a threshold voltage and a leakage current, wherein the leakage current occurs between the control electrode and the first current electrode during the sleep mode;
   an amplifier having an output coupled to the control electrode of the power transistor that provides an active output during the active mode; and
   a protection circuit coupled to the control electrode of the power transistor, wherein the protection circuit detects the leakage current and prevents the leakage current from developing a first voltage on the control electrode of the power transistor that exceeds the threshold voltage of the power transistor, wherein the protection circuit prevents the leakage current from developing the first voltage by providing a current path to pull down a voltage on the control electrode of the power transistor.

2. The first circuit of claim 1, wherein the protection circuit comprises:
   a current mirror circuit coupled to the first power supply terminal having a first input coupled to the control electrode of the power transistor and having a second input coupled to receive a sleep signal.

3. The first circuit of claim 2, wherein the second input is coupled to the sleep signal through a buffer circuit.

4. The first circuit of claim of 3 wherein the buffer circuit comprises:
   a first transistor having a control electrode coupled to the sleep signal, a first current electrode coupled to the power supply terminal, and a second current electrode; and
   a resistance having a first terminal coupled to the second current electrode of the first transistor and a second terminal coupled to a second power supply terminal.

5. The first circuit of claim 2, wherein the current minor has an output, the protection circuit further comprising a first transistor having a first current electrode coupled to the gate of the power transistor, a control electrode coupled to the output of the current mirror, and a second current electrode coupled to the output of the first circuit.

6. The first circuit of claim 1, wherein the amplifier comprises:
   a first N channel transistor having a control electrode for receiving an input signal, a drain coupled to the control electrode of the power transistor; a source coupled to the output of the first circuit, and a body connected to the output of the first circuit; and
   a first P channel transistor having a control electrode for receiving the input signal, a drain coupled to the control electrode of the power transistor; a source coupled to a boosted voltage having a voltage level that is above a voltage level at the first power supply terminal, and a body connected to the boosted voltage.

7. A first circuit having an active mode and a sleep mode, comprising:
   a power transistor having a first current electrode coupled to a first power supply terminal, a second current electrode as an output of the first circuit for coupling to a load, and a first control electrode, wherein the power transistor is characterized by having a threshold voltage and a leakage current, wherein the leakage current occurs between the first control electrode and the first current electrode during the sleep mode;
   an amplifier having an output coupled to the first control electrode of the power transistor that provides an active output during the active mode; and
   a protection circuit that detects the leakage current and prevents the leakage current from developing a voltage on the first control electrode of the power transistor that exceeds the threshold voltage of the power transistor, wherein the protection circuit includes:
      a first transistor having a third current electrode coupled to the first control electrode of the power transistor, a second control electrode, and a fourth current electrode coupled to the output of the first circuit, and
      a current mirror circuit coupled to the first power supply terminal and having a first current mirror input coupled to the first control electrode of the power transistor, a second current mirror input coupled to receive a sleep signal, a first current mirror output coupled to the second control electrode of the first transistor, and a second current mirror output coupled to the output of the first circuit, wherein the current minor circuit comprises:
         a current mirror coupled to the first power supply terminal having a first leg and a second leg;
         a second transistor having a third control electrode as the first current mirror input, a fifth current electrode coupled to the first leg, and a sixth current electrode coupled to the second current minor output;
         a load circuit having a first terminal coupled to the second control electrode of the first transistor and a second terminal coupled to the second current mirror output; and
         an input transistor having a fourth control electrode as the second current mirror input, a seventh current electrode coupled to the second leg, and an eighth current electrode coupled to the first power supply terminal.

8. The first circuit of claim 7, wherein the load circuit comprises a diode-connected transistor in series with a first resistance, wherein the diode-connected transistor and the first transistor have a same threshold voltage.

9. The first circuit of claim 8, wherein the current minor circuit further comprises a third transistor coupled between the input transistor and the second leg, wherein the second leg is coupled to the seventh current electrode of the input transistor through the third transistor.

10. The first circuit of claim 9, further comprising:
   a second resistance having a first terminal coupled to the first power supply terminal and a second terminal;
   a fourth transistor having a fifth control electrode for receiving a boosted voltage having a voltage level that is above a voltage level at the first power supply terminal, a ninth current electrode coupled to the second terminal of the second resistance; and a tenth current electrode; and
   a fifth transistor coupled in series between the second current mirror output and the tenth current electrode of the fourth transistor.

11. A method that is for operating a power transistor using a sleep mode and an active mode, wherein during the sleep mode the power transistor has a leakage current between a control electrode and a current electrode, wherein the power transistor has a threshold voltage, comprising:
- applying an input signal to the control electrode of the power transistor during the active mode;
- detecting the leakage current during the sleep mode; and
- responsive to detecting the leakage current, providing a current drain on the control electrode of the power transistor during the sleep mode of sufficient magnitude to pull down a voltage on the control electrode of the power transistor to ensure that the threshold voltage of the power transistor is not exceeded during the sleep mode.

12. The method of claim 11, further comprising removing the current drain during the active mode.

13. The method of claim 12, wherein the step of detecting comprises:
- detecting the voltage on the control electrode of the power transistor; and
- converting the voltage to a first current.

14. The method of claim 13, wherein the step of providing a current drain comprises:
- converting the first current to a second current; and
- converting the second current to the current drain.

15. The method of claim 14, wherein the step of converting the second current to the current drain comprises:
- converting the second current to a bias voltage; and
- converting the bias voltage to the current drain.

16. The method of claim 12, further comprising using a current mirror circuit to detect the leakage current and to provide the current drain.

17. A power driver circuit having an active mode and a sleep mode for driving a power transistor having a first current electrode coupled to a first power supply terminal, a second current electrode for being coupled to a load, and a control electrode, wherein the power transistor is characterized by having a threshold voltage and a leakage current, wherein the leakage current occurs between the control electrode and the first current electrode during the sleep mode, comprising:
- an amplifier having an output for being coupled to the control electrode of the power transistor, wherein the amplifier provides an active output during the active mode; and
- a protection circuit means coupled to the output of the amplifier and to the control electrode of the power transistor, wherein the protection circuit is for detecting the leakage current and preventing the leakage current from developing a first voltage on the control electrode of the power transistor that exceeds the threshold voltage of the power transistor, wherein the protection circuit means prevents the leakage current from developing the first voltage by providing a current path to pull down a voltage on the control electrode of the power transistor.

18. The power driver circuit of claim 17, wherein the protection circuit means prevents the leakage current from developing the voltage on the control electrode of the power transistor that exceeds the threshold voltage of the power transistor by establishing a current drain on the gate of the power transistor.

19. The power driver circuit of claim 17, wherein the protection circuit means comprises:
- a current drain circuit for being coupled to the control electrode of the power transistor; and
- a current mirror circuit for being coupled to the control electrode of the power transistor and controlling the current drain circuit.

20. The power driver circuit of claim 19 wherein the current mirror circuit detects the leakage current and biases the current drain circuit based on the magnitude of the leakage current.

* * * * *